(12) United States Patent
Daw

(10) Patent No.: US 7,155,043 B2
(45) Date of Patent: Dec. 26, 2006

(54) USER INTERFACE HAVING ANALYSIS STATUS INDICATORS

(75) Inventor: Shawni Daw, Redmond, WA (US)

(73) Assignee: Confirma, Incorporated, Kirkland, WA (US)

( * ) Notice: Subject to any disclaimer, the term of this patent is extended or adjusted under 35 U.S.C. 154(b) by 796 days.

(21) Appl. No.: 09/990,947

(22) Filed: Nov. 21, 2001

(65) Prior Publication Data

US 2003/0095147 A1 May 22, 2003

(51) Int. Cl.
*G06K 9/00* (2006.01)
(52) U.S. Cl. ...................... 382/128; 128/920
(58) Field of Classification Search ........ 382/128–134; 128/920–925
See application file for complete search history.

(56) References Cited

U.S. PATENT DOCUMENTS

| | | | |
|---|---|---|---|
| 4,839,805 A | 6/1989 | Pearsons, Jr. et al. | 364/413.14 |
| 5,262,945 A | 11/1993 | DeCarli et al. | 364/413.13 |
| 5,293,313 A * | 3/1994 | Cecil et al. | 382/131 |
| 5,311,131 A | 5/1994 | Smith | 324/309 |
| 5,410,250 A * | 4/1995 | Brown | 324/309 |
| 5,638,465 A | 6/1997 | Sano et al. | 382/281 |
| 5,644,232 A | 7/1997 | Smith | 324/309 |
| 5,754,676 A * | 5/1998 | Komiya et al. | 382/132 |
| 5,779,634 A * | 7/1998 | Ema et al. | 600/407 |
| 5,805,118 A * | 9/1998 | Mishra et al. | 345/1.1 |
| 5,818,231 A | 10/1998 | Smith | 324/309 |
| 5,987,345 A * | 11/1999 | Engelmann et al. | 600/407 |
| 6,067,371 A * | 5/2000 | Gouge et al. | 382/128 |
| 6,466,687 B1 * | 10/2002 | Uppaluri et al. | 382/128 |
| 6,901,277 B1 * | 5/2005 | Kaufman et al. | 600/407 |
| 2002/0097902 A1 * | 7/2002 | Roehrig et al. | 382/132 |

(Continued)

FOREIGN PATENT DOCUMENTS

JP 8 69533 A 3/1996

OTHER PUBLICATIONS

Dasarathy, "Is Your Nearest Neighbor Near Enough a Neighbor?" in *Proceedings of the First International Conference on Information Sciences and Systems*, Patras, Greece, 1976, pp. 114-117.

(Continued)

*Primary Examiner*—Jingge Wu
*Assistant Examiner*—Aaron Carter
(74) *Attorney, Agent, or Firm*—Davis Wright Tremaine LLP; Michael J. Donohue

(57) ABSTRACT

A memory is provided for storing a plurality of data sets, each data set corresponding to an image of a location within a medical body of interest. Each image contains a number of features which correspond to data points that have been collected when creating an image of the medical body. The data points thus correspond to a measured parameter within the medical body. A visual display is provided of the image having a varying color scale for different regions of interest within the body. Medical personnel are able to select various regions of interest within the image for which further study is desired. In addition, within the region of interest the medical personnel may select a particular feature representing data corresponding to medical information within the body for which further study is desired and have the computer perform an analysis to compare to or locate other tissue of the same type elsewhere in the data sets. When such data analysis are performed on the images, analysis indicators are provided in the upper left hand corner of the display providing an easy to view indication of the results and status of any computer analysis being performed or that has been performed on the data.

17 Claims, 10 Drawing Sheets
(7 of 10 Drawing Sheet(s) Filed in Color)

U.S. PATENT DOCUMENTS

| | | | |
|---|---|---|---|
| 2002/0193676 A1* | 12/2002 | Bodicker et al. | 600/407 |
| 2003/0016850 A1* | 1/2003 | Kaufman et al. | 382/128 |
| 2003/0174872 A1* | 9/2003 | Chalana et al. | 382/128 |
| 2005/0251021 A1* | 11/2005 | Kaufman et al. | 600/407 |

OTHER PUBLICATIONS

Bezdek, et al., "FCM: The Fuzzy c-Means Clustering Algorithm," *Computers & Geosciences*, 10(2-3):191-203, 1984.

Vannier et al., "Multispectral Analysis of Magnetic Resonance Images," *Radiology*, 154(1):221-224, 1985.

Xie et al., "A Validity Measure for Fuzzy Clustering," *IEEE Transactions on Pattern Analysis and Machine Intelligence*, 13(8):841-847, 1991.

Clarke et al., "Comparison of Supervised Pattern Recognition Techniques and Unsupervised Methods for MRI Segmentation," *Medical Imaging VI: Image Processing*, 1652:668-677, 1992.

Taxt et al., "Multispectral Analysis of Uterine Corpus Tumors in Magnetic Resonance Imaging," *Magnetic Resonance in Medicine*, 23:55-76, 1992.

Bezdek et al., "Review of MR Image Segmentation Techniques Using Pattern Recognition," *Medical Physics*, 20(4):1033-1048, 1993.

Taxt et al., "Multispectral Analysis of the Brain Using Magnetic Resonance Imaging," *IEEE Transactions on Medical Imaging*, 13(3):470-481, 1994.

Clarke et al., "MRI Segmentation: Methods and Applications," *Magnetic Resonance Imaging*, 13(3):343-368, 1995.

Dasarathy "Adaptive Decision Systems with Extended Learning for Deployment in Partially Exposed Environments," *Optical Engineering*, 34(5):1269-1280, 1995.

Pham et al., "Partial Volume Estimation and the Fuzzy C-means Algorithm," 4 pages.

Mussurakis et al., "Dynamic MRI of Invasive Breast Cancer: Assessment of Three Region-of-Interest Analysis Methods." *Journal of Computer Assisted Tomography*, 21(3):431-438 1997.

Samarasekera et al., "A New Computer-Assisted Method for the Quantification of Enhancing Lesions in Multiple Sclerosis," *Journal of Computer Assisted Tomography*, 21(1):145-151, 1997.

"Spatial Filtering," Digital Image Processing 4.3, pp. 189-195.

Clark et al., "Automatic Tumor Segmentation Using Knowledge-Based Techniques," *IEEE Transactions on Medical Imaging*, 17(2):187-201, 1998.

Clarke et al., "MRI Measurement of Brain Tumor Response: Comparision of Visual Metric and Automatic Segmentation," *Magnetic Resonance Imaging*, 16(3):271-279, 1998.

Houben et al., "Distance Rejection in the Context of Electric Power System Security Assessment Based on Automatic Learning," in *Proceedings of Advances in Pattern Recognition: Joint IAPR International Workshops SSPR '98 and SPR '98*, Sydney, Australia, 1998, pp. 756-764.

Parker et al., "MRIW: Parametric Analysis Software for Contrast-Enhanced Dynamic MR Imaging in Cancer," *RadioGraphics*, 18(2):497-506, 1998.

Reiss et al., "Reliability and Validity of an Algorithm for Fuzzy Tissue Segmentation of MRI," *Jornal of Computer Assisted Tomography*, 22(3):471-479, 1998.

Weinstein et al., "Breast Fibroadenoma: Mapping of Pathophysiologic Features with Three-Time-Point, Contrast-Enhanced MR Imaging—Pilot Study," *Radiology*, 210(1):233-240, 1999.

Kuhl et al., "Dynamic Breast MR Imaging: Are Signal Intensity Time Course Data Useful for Differential Diagnosis of Enhancing Lesions?," *Radiology*, 211(1):101-110, 1999.

Orel, "Differentiating Benign from Malignant Enhancing Lesions Identified at MRI Imaging of the Breast: Are Time-Signal Intensity Curves an Accurate Predictor?," *Radiology*, 211(1):5-7, 1999.

Liney et al., "Dynamic Contrast-Enhanced MRI in the Differentiation of Breast Tumors: User-Defined Versus Semi-Automated Region-of-Interest Analysis," *Journal of Magnetic Resonance Imaging* 10:945-949, 1999.

Hylton, "Vascularity Assessment of Breast Lesions with Gadolinium-Enhanced MR Imaging," *MRI Clinics of North America*, 9(2):321-331, 2001.

* cited by examiner

USER INTERFACE HAVING ANALYSIS STATUS INDICATORS

BACKGROUND OF THE INVENTION

1. Field of the Invention

This invention relates to improved visual display of medical images, and in particular to an apparatus and method for providing an improved user interface for use by medical personnel in reviewing medical images.

2. Description of the Related Art

The collection and storage of a large number of medical images is currently carried out by a number of systems. The medical images can be collected by a variety of techniques, such as nuclear magnetic resonance (NMR), magnetic resonance imaging (MRI), computed tomography (CT) ultrasound, and x-rays. One system which is disclosed for collecting a large number of medical images of a human body is disclosed U.S. Pat. Nos. 5,311,131 and 5,818,231 to Smith. These patents describe an MRI apparatus and method for collecting a large number of medical images in various data sets. The data are organized and manipulated in order to provide visual images to be read by medical personnel to perform a diagnosis.

One of the problems in reading a large number of images is for the medical personnel to understand the relationship of the images to each other while performing the reading. Another difficult task is interpreting the medical significance of various features which are shown in the individual images. Being able to correlate the images with respect to each other is extremely important in deriving the most accurate medical diagnosis from the images and in setting forth a standard of treatment for the respective patient. Unfortunately, such a coordination of multiple images with respect to each other is extremely difficult and even highly trained medical personnel, such as experienced radiologists, have extreme difficulty in consistently and properly interpreting a series of medical images so that a treatment regime can be instituted which best fits the patient's current medical condition.

Another problem encountered by medical personnel today is the large amount of data and numerous images which are obtained from current medical imaging devices. The number of images collected in a standard scan is usually in excess of 100 and very frequently numbers in the many hundreds. In order for medical personnel to properly review each image takes a great deal of time and, with the many images that current medical technology provides, a great amount of time is required to thoroughly examine all the data.

BRIEF SUMMARY OF THE INVENTION

According to principles of the present invention, a user interface is provided which greatly enhances the ability of medical personnel to locate images which have data of greater importance, understand the image data, and compare the data in one image with data in another image. This permits a more accurate assessment of the medical condition of the respective patient.

A memory is provided for storing a plurality of data sets, each data set corresponding to an image of a location within a medical body of interest. Each image contains a number of features which correspond to data points that have been collected when creating an image of the medical body. The data points thus correspond to a measured parameter within the medical body. A visual display is provided of the image having a varying color scale for different regions of interest within the body. Medical personnel are able to select various regions of interest within the image for which further study is desired. In addition, within the region of interest the medical personnel may select a particular feature representing data corresponding to medical information within the body for which further study is desired and have the computer perform an analysis to compare to or locate other tissue of the same type elsewhere in the data sets. When such data analysis are performed on the images, analysis indicators are provided in the upper left hand corner of the display providing an easy to view indication of the results and status of any computer analysis being performed or that has been performed on the data.

According to one embodiment of the present invention, the display of the image as part of the user interface includes two separate windows on the visual display. Within one window of the visual display the main image under study is shown. In another portion of the visual display, such as in an upper, central portion of the screen, a window having a plurality of miniature images is simultaneously displayed. In each of these images, a mark is provided in the form of an analysis indicator that indicates whether or not the image analysis resulted in an image that has tissue which matches the reference tissue under examination. This analysis indicator is provided in relationship to the image so a viewer can easily match which of the images contain tissue of interest for the study. The viewer can then quickly go to the enlarged version of the image of interest and study it in detail in order to perform a more detailed review of the medical condition of the patient.

In order to perform the image analysis to prepare the data to carry out the present invention, a medical person selects the region of interest and the computer performs clustering within the region of interest to sort the pixels into classes, the medical person selects one or more of the clusters to represent the reference tissue of interest, and then it is desired to examine the rest of the medical image to see whether other data points have similar characteristics to those within the selected, clustered region of interest. An acceptable technique for selecting a region of interest, performing clustering, and then carrying out analysis on the pixels of the medical image data are described in co-pending patent application Ser. No. 09/722,063 filed on Nov. 24, 2000, to Stork et al. and owned by the current assignee of the present invention, which is incorporated herein by reference in its entirety. Also of interest is U.S. patent application Ser. No. 09/721,931 filed on Nov. 24, 2000, by Stork et al., also owned by the assignee of the present application and incorporated herein by reference in its entirety.

According to one embodiment of the image analysis invention, an overlay in the color scale is provided indicating the different tissues which belong to different classes within the region of interest. When the image analysis is done, the corresponding color scale variation is applied to all pixels representing same tissue throughout the data set of all images. The color scale variation can be any acceptable color scale such as a grayscale of type commonly used in x-ray, ultrasound, and some MRI scans. Of course, the color scale variation can also include various colors of the spectrum including red, green, magenta, yellow, orange, or any other acceptable color of the type commonly available on computer display screens. Preferably, a color is selected which is easily detectable by the user, and optionally appears as an overlay on the image so the features of the image can be seen underneath the color overlay. Therefore, the user is allowed to toggle between a bright solid color, which is easily detected, and a transparent or semi-transparent feature which shows the overlay as a variation in grayscale or light color overlaying the image.

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
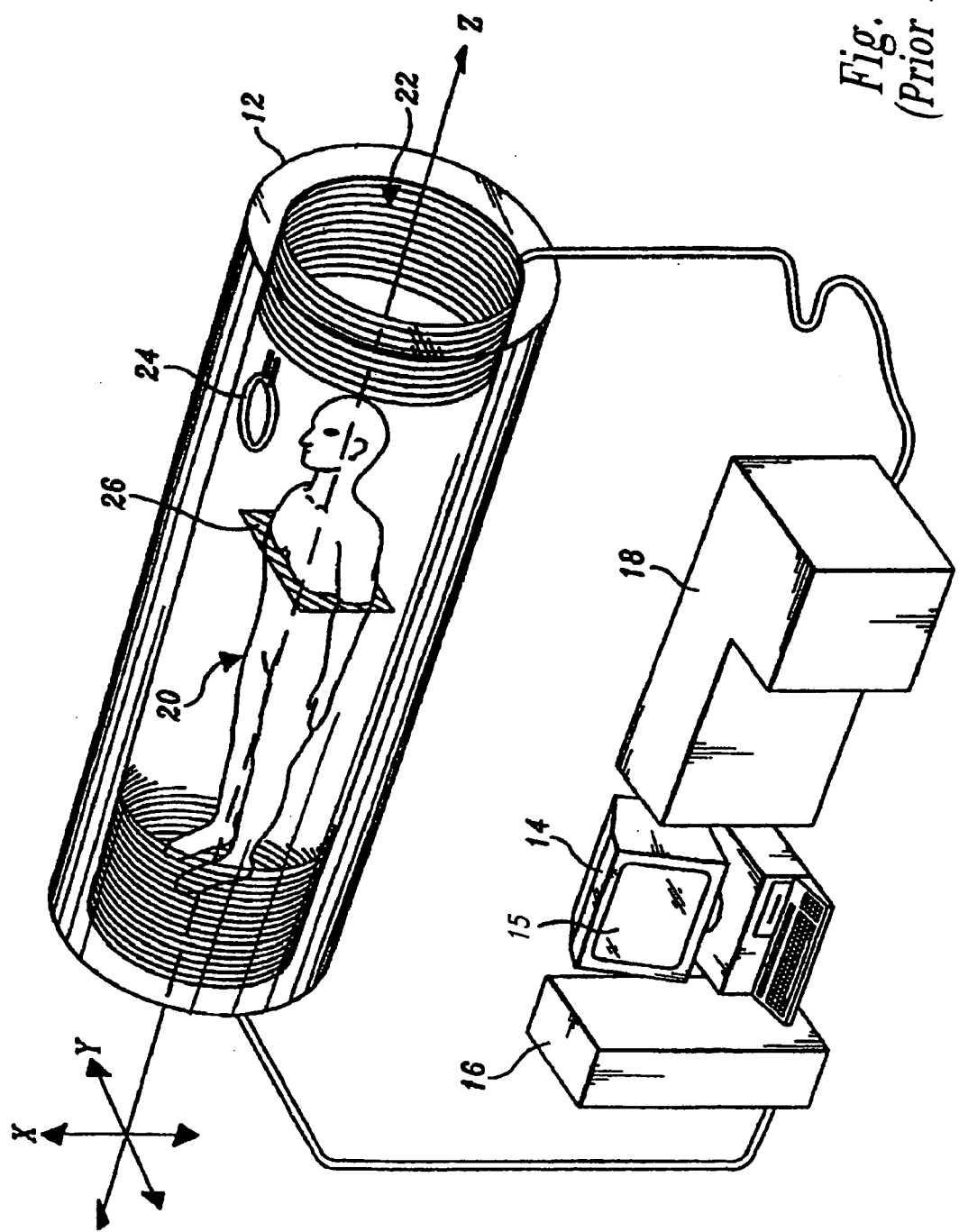
FIG. 1 is a schematic view of a data collection system according to the prior art.

FIG. 1 is a known sensor and data collection device as described in U.S. Pat. No. 5,644,232. It illustrates one technique by which data can be collected for analysis according to the principles of the present invention.

Details of magnetic resonance imaging methods are disclosed in U.S. Pat. No. 5,311,131, entitled, "Magnetic Resonance Imaging Using Pattern Recognition:" U.S. Pat. No. 5,644,232, entitled, "Quantitation and Standardization of Magnetic Resonance Measurements:" and U.S. Pat. No. 5,818,231, entitled, "Quantitation and Standardization of Magnetic Resonance Measurements." The above-referenced three patents are incorporated in their entirety herein by reference. The technical descriptions in these three patents provide a background explanation of one environment for the invention and are beneficial to understand the present invention.

Pattern recognition is utilized in several disciplines and the application of thresholding as described with respect to this invention is pertinent to all of these fields. Without the loss of generality, the examples and descriptions will all be limited to the field of magnetic resonance imaging (MRI) for simplicity. Of particular interest is the application of pattern recognition technology in the detection of similar lesions such as tumors within magnetic resonance images. Therefore, additional background on the process of MRI and the detection of tumor using MRI is beneficial to understand the invention.

Magnetic resonance (MR) is a widespread analytical method used routinely in chemistry, physics, biology, and medicine. Nuclear magnetic resonance (NMR) is a chemical analytical technique that is routinely used to determine chemical structure and purity. In NMR, a single sample is loaded into the instrument and a representative, multivariate, chemical spectrum is obtained. The magnetic resonance method has evolved from being only a chemical/physical spectral investigational tool to an imaging technique, MRI, that can be used to evaluate complex biological processes in cells, isolated organs, and living systems in a non-invasive way. In MRI, sample data are represented by an individual picture element, called a pixel, and there are multiple samples within a given image.

Magnetic resonance imaging utilizes a strong magnetic field for the imaging of matter in a specimen. MRI is used extensively in the medical field for the noninvasive evaluation of internal organs and tissues, including locating and identifying benign or malignant tumors.

As shown in FIG. 1, a patient 20 is typically placed within a housing 12 having an MR scanner, which is a large, circular magnet 22 with an internal bore large enough to receive the patient. The magnet 22 creates a static magnetic field along the longitudinal axis of the patient's body 20. The magnetic field results in the precession or spinning of charged elements such as the protons. The spinning protons in the patient's tissues preferentially align themselves along the direction of the static magnetic field. A radio frequency electromagnetic pulse is applied, creating a new temporary magnetic field. The proton spins now preferentially align in the direction of the new temporary magnetic field. When the temporary magnetic field is removed, the proton spin returns to align with the static magnetic field. Movement of the protons produces a signal that is detected by an antenna 24 associated with the scanner. Using additional magnetic gradients, the positional information can be retrieved and the intensity of the signals produced by the protons can be reconstructed into a two or three dimensional image.

The realignment of the protons' spin with the original static magnetic field (referred to as relaxation) is measured along two axes. More particularly, the protons undergo a longitudinal relaxation ($T_1$) and transverse relaxation ($T_2$). Because different tissues undergo different rates of relaxation, the differences create the contrast between different internal structures as well as a contrast between normal and abnormal tissue. Thus, the signal intensity is proportional to a combination of the number of protons, the $T_1$ and the $T_2$ properties of the tissue. Proton density weighted images generally emphasize differences in the number of protons between different tissues, while $T_1$-weighted images generally emphasize the difference in $T_1$ relaxation times between different tissues. Similarly, $T_2$-weighted images emphasize the difference in $T_2$ relaxation times between different tissues. By manipulating the parameters of the MR scanner, an operator can produce a first series of images that are dominated by $T_1$ and a second series of images dominated by $T_2$ relaxation (i.e., $T_1$-weighted and $T_2$-weighted images) or a series related to proton density. In addition to series of images composed of $T_1$, $T_2$, and proton density, variations in the sequence selection permit the measurement of chemical shift, proton bulk motion, diffusion coefficients, and magnetic susceptibility using MR. The information obtained for the computer guided tissue segmentation may also include respective series that measure such features as: a spin-echo (SE) sequence; two fast spin-echo (FSE) double echo sequences; and fast stimulated inversion recovery (FSTIR) or any of a variety of sequences approved for safe use on the imager. Contrast agents are types of drugs which may be administered to the subject. If given, contrast agents typically distribute in various compartments of the body over time and provide some degree of enhanced image for interpretation by the user. In addition to the above, pre- and post-contrast sequence data series were acquired. In other embodiments, a T1, T2, proton density, and four echo series were acquired. Any acceptable data acquisition method, sequences and combinations thereof, can be used to collect the data according to the present invention. Thus, by using multiple sequences, multivariate image data can be obtained. Each pixel can be considered a sample and by using different sequences to image the same physical location, each sequence produces a new measurement for the sample.

Each data element under consideration has one or more properties which describe a corresponding portion of the object which the data element represents. Each of these properties has a numerical value. For example, if the image which has been acquired is an MRI image, then the properties of each data element may include such features as the longitudinal relaxation factor, T1, or the transverse relaxation factor, T2, weighted T1 or T2 images, the proton density space, or other parameters which are normally measured in an MRI, as is known in the art. Therefore, each of the data elements known has the numerical value which is related to each of the properties that provides a description of the data element. Each data element will thus be described by several different numbers, one number for each of the properties stored. The data is thus multivariate. The numerical values may be thought of as defining the position of a data element in multi-dimensional space and reflecting the magnetic resonance properties of the tissue corresponding to that location. Namely, each one of the parameters represents one of the dimensions for the location of the object in a Euclidean geometry field. If two properties of an object are stored for each data element, then the field becomes a two-dimensional Euclidean plane. If three parameters are stored, then the data element can be considered as being at a location in a three-dimensional Euclidean field. Similarly, if four physical parameters are represented, then the object may be considered as being at a location in a four-dimensional Euclidean field. Each data element, therefore, has a location within the multi-dimensional Euclidean field.

When displayed as an image, the collected data can be represented as pixels, voxels, or any other suitable representation. Within the visual display, the intensity, color, and other features of the respective data point, whether termed a pixel, voxel, or other representation, provides an indication of the medical parameter of interest. (As used herein, the term "pixel" will be used in the broad, generic sense to include any individual component which makes up a visual image which is under examination and includes within the meaning such things as pixels, data point representing two-dimensional data, voxels having three or more dimensional data, a grayscale data point or other visual component from an MRI image, NMR, CT, ultrasound, or other medical image.) The medical image thus contains a large number of pixels each of which contain data corresponding to one or more medical parameters within a patient, an entire image being made up of a large number of pixels.

In FIG. 1, an object to be examined, in this case a patient's body 20, is shown. A slice 26 of the body 20 under examination is scanned and the data collected. The data are collected, organized and stored in a signal processing module 18 under control of a computer 14. A display 15 may display the data as they are collected and stored. It may also provide an interface for the user to interact with and control the system. A power supply 16 provides power for the system.

The current known clinical standard for locating tumor tissue with MRI involves having an experienced radiologist interpret the images for suspected lesions. Radiologists are skilled in detecting anatomic abnormalities and in formulating differential diagnoses to explain their findings. Unfortunately, only a small fraction of the wealth of information generated by magnetic resonance is routinely available because the human visual system is unable to correlate the complexity and volume of data. The specific problem is that radiologists try to answer clinical questions precisely regarding the location of certain tissues, but seldom can they extract enough information visually from the images to make a specific diagnosis because the tissues are very complex and therefore difficult to accurately segment in the image provided. This problem is compounded for MRI which produces many different types of images during a single imaging session.

To use all of the information created by an MRI examination, radiologists have to simultaneously view several images created with different MR scanner settings and understand the simultaneous complex relationships among millions of data. The unassisted human visual system is not capable of seeing, let alone processing, all of the information. Consequently, much of the information generated by a conventional MRI study is wasted. Consequently, there is a great need to efficiently utilize more of the existing MR information to more accurately segment the various tissues and thereby improve the confidence of conclusions drawn from the interpretations of medical images. Because a proper determination of the location and the extent of a tumor (a process called staging) will determine the course of treatment and may impact the likelihood of recovery, accurate staging is important for proper patient management.

Figure 2:
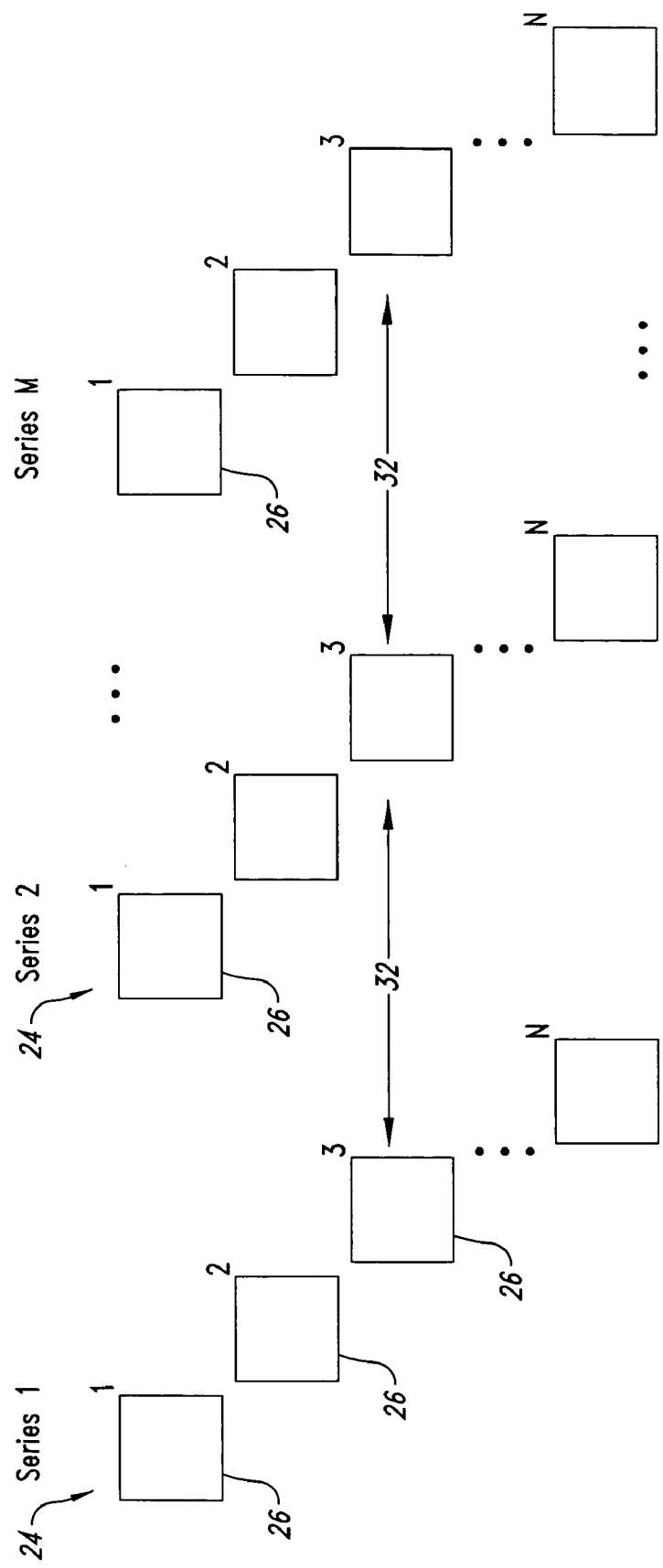
FIG. 2 is a schematic representation of the various images which may be obtained from a data collection system.

FIG. 2 illustrates the image data which may be collected according to principles of the present invention and shows the problems that may be encountered by medical personnel, such as a radiologist's attempt to interpret the meaning of the various images. The medical images which are obtained can be considered as being organized a in number M of different series 24. Each series 24 is comprised of data which is collected by a single technique and its corresponding imager settings. For example, one series 24 may be made up of T1 weighted images. A second series 24 may be made up of T2 weighted images. A third series 24 may be made up of a spin echo sequence (SE). Another series 24 may be made up of a STIR or inversion recovery sequence. A number of series may be obtained during the data collection process. It is typical to obtain between six and eight series 24 and in some instances, ten or more different series 24 of data for a single patient during a data collection scan.

Each series 24 is composed of a large number of images, each image representing a slice 26 within the medical body under examination. The slice 26 is a cross-sectional view of particular tissues within a plane of the medical body under interest. A second slice 26 is taken spaced a small distance away from the first slice 26. A third slice 26 is then taken spaced from the second slice. A number of slices 26 are taken in each series 24 for the study being conducted until N slices have been collected and stored. Under a normal diagnostic study, in the range of 25–35 slices are collected within a single series. Of course, in a detailed study, the number of slices 26 being obtained may be much higher for each series. For example, it may number in the hundreds in some examples, such as for a brain scan, when a large amount of data is desired, or a very large portion of the medical body is being tested. Generally, each series 24 has the same number of slices and further, the slice 26 in each series is taken at the same location in the body as the corresponding slice 26 in the other series. The slices 26 of the same number in the different series 24 thus are from the same location in the human body in each series. A slice set 32 is made up of one slice from each of the series taken at the same location within the medical body under study. For example, a group made of slice number three from each of the series 24 would comprise a slice set 32. Being able to assemble and understand the various data in a slice set 32 can be very valuable as a diagnostic tool.

If each series 24 has a typical number of slices, such as 30 and there are 6 to 8 series collected then the total number of images collected is in the range of 180 to 240 distinct and separate images. Just viewing each image individually is an extremely difficult, and burdensome task. Even if time permits that all the images can be all viewed, sorting them in a meaningful sequence and understanding the relationship among the various slices and various series is extremely difficult. Even though the image data are stored on a computer and the medical personnel have access to a computer database for retrieving and viewing the images, the massive amount of information contained in the various images together with the huge number of images which are available make properly reading and understanding all of the date in the images a very time consuming and difficult task. During the time consuming and difficult nature of the task of viewing, comparing, and correlating all of the various images the medical personnel may sometimes miss important diagnostic information within a particular image. If this diagnostic information is not properly viewed and interpreted as compared to the other images, errors may be made in understanding the patient's medical condition which may result in errors related to the medical procedures and protocol used in caring for the patient.

This invention provides a user interface which accurately, and easily provides to the medical personnel access to all of the collected data for a particular patient as will now be explained. Such an interface is valuable in order to ensure that a proper medical diagnosis is made and that proper treatment is carried out for the particular patient based on accurate knowledge of their medical condition.

Figure 3:
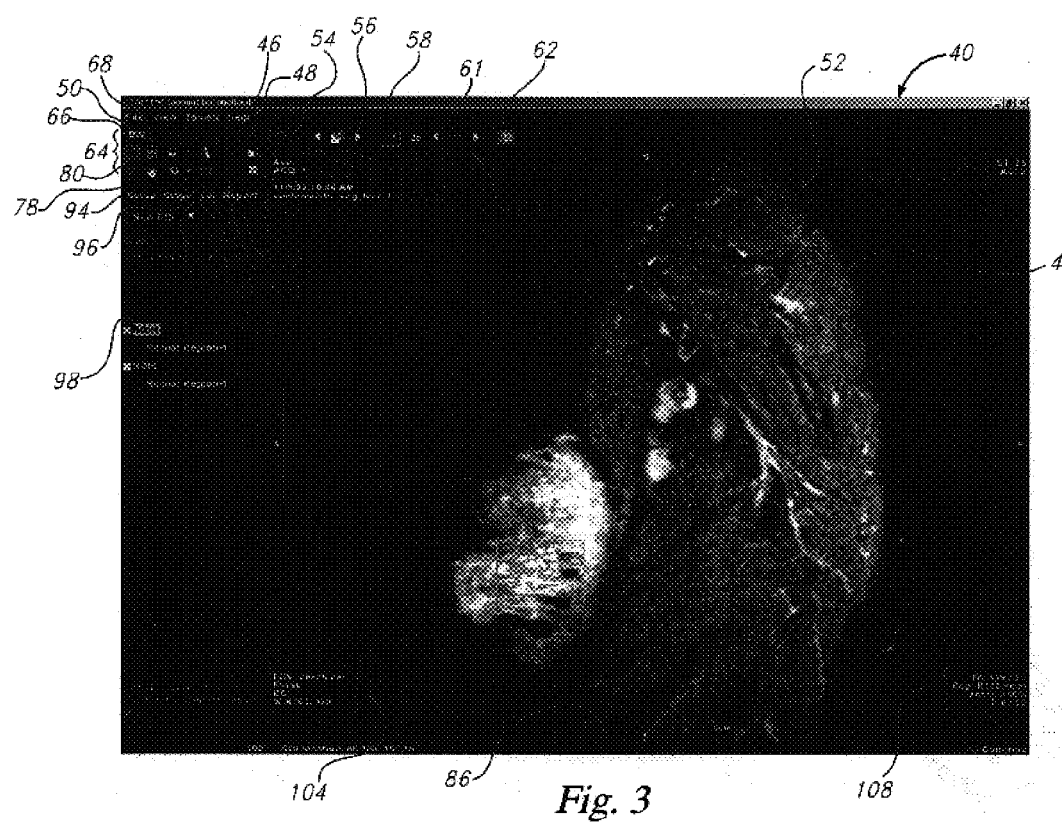
FIG. 3 is a user interface according the principles of the present invention.

FIG. 3 illustrates a user interface for use by medical personnel for examining the medical image according to principles of the present invention. The user interface includes a computer screen having a medical image 42 shown thereon. The medical image shown as one example for illustrating the present invention is examination for breast cancer and a study whether or not the cancer has metastasized and spread to other tissues within the patient. Of course, the invention is equally applicable to all sorts of medical images of different parts of the body. It may be particularly beneficial for brain image data, lymph node image data or many other types of tissue which are susceptible to cancers or other diseases which spread to different locations within the body.

The medical image 42 has positioned thereon a region of interest 44 within a box which has been created by a user using the user interface of the present invention. The box indicates within it those pixels which are to be studied within the region of interest in order to assist in the medical diagnosis. Within the region of interest 44, clustering of the various types of tissue is performed and a color scale image is applied to the various clusters of data using the appropriate color scheme, such as grayscale, light tone colors or others which the user may select in order to give the greatest contrast and highlight of the tissues under study according to the present invention as will be explained later with respect to FIG. 9 herein. More detailed explanation of selecting the region of interest, performing clustering and performing segmentation can be found in co-pending application Ser. No. 09/722,063 to Stork et al. as previously mentioned.

The user interface according to the principles of the present invention is particularly beneficial for organizing medical records and diagnosing medical conditions as will now be explained. On the single user interface screen is contained a large amount of information in a compact, easy to use format to aid in proper understanding of the large amount of image data which is stored in the computer. The uppermost left-hand corner contains an indication 46 of the computer program being run. Immediately below the program identity 46 is a menu bar line 48 which contains a number of commands available to the medical technician. The menu bar line 48 includes such commands as file, view, toolkit, and help. Of course, many other commands may be available and pull-down menus are obtained by clicking on any one of these items within the menu button, such pull-down menus being well known in the art and are therefore not described in any greater detail herein. Immediately below the menu bar 46 is a patient ID box 50. In the current drawing, the letters "BW" are provided as an example of patient ID though of course, the medical personnel may enter therein other data uniquely identifying the patient, such as patient's name, patient ID number or other acceptable information. Below the menu bar 48 is a command selection area.

To the right-hand side of the patient ID block 50 and extending across the top of the screen is a large amount of information and user control buttons which are particularly useful in the user interface of the present invention. A date box 54 provides the date and year that the image data was collected. Next is a series selection box 56 which lets a user select which of the image series he wishes to study. At the simple command and touch of a button any one of the collective series can be made instantly available and one or more slices from the series displayed on the screen using the user interface of the present invention. By clicking on the left-hand arrow the selected series moves down one number and by clicking on the right hand arrow, the series number moves up so that a user may easily scroll through each of the series, typically in the range of six to eight different series and then look at selected slices within each of the series.

In a preferred embodiment, once a slice has been selected in a series. Moving the image data from one series to another will display the same slice number in the different series. The medical personnel may thus look at slice number 6 in the T1 series data, then slice number 6 within the T2 series data, then in the same slice 6 in the STIR series or any of the other series which is desired. The ability to rapidly examine the same relative slice in each of the series provides significant advantages in performing medical diagnosis. This provides tremendous advantages to medical personnel who wish to compare a slice within one series to another within a particular medical body of interest. Additionally, slices can be organized in a slice set and have each slice from the set displayed simultaneously, or in sequence, one after the other so as to provide improved interpretation and reading by medical personnel. Adjacent to series selection box 56 is a slice identification box 58. This indicates which slice number is currently being examined of the total slices which are available.

Next to the slice identification box 58 is a slice selection box 60. The slice selection box 60 has a number of features which are beneficial to medical personnel to provide a useful user interface according to the present invention. By clicking on the left arrow, the user is able to move the slice selected down one number in sequence and by clicking on the right arrow can move it up one number in the series. The user can therefore rapidly move to any desired slice within the entire series by moving incrementally up one or down one at a desired time after sufficient study of each slice. Within the slice selection button 60 is a thumbnail generation window 61. The thumbnail generation window 61 has particular advantages which are described in more detail with respect to FIGS. 5 and 6 herein.

Analysis overlay box 62 permits the user to input a command to overlay on top of the visual image a color scale showing the results of a performed image analysis. Clicking on the overlay analysis button 62 toggles the color overlay from being on to being off. This permits the user to view the data with the enhanced color overlay showing the results of analysis for a similar tissue segmentation for aid in locating the spread of malignant tumors and cancer cells. Pressing the button again toggles the device off so as to provide the original visual image without modification so the user may study these data.

The on/off analysis overlay button provides advantages to the user in providing an easy way to quickly switch from viewing the computer analyzed visual image and the unanalyzed visual image. Once the analysis has taken place, which may take a period of time since it is very data intensive and a large dataset is involved, the results are stored in the computer. The user can therefore view the visual image with the analysis color overlay present and then turn off the visual display to the analysis. It is still saved in a stored file and can be quickly and easily recalled and applied to the visual image with a simple click of the analysis overlay button 62.

The user interface also includes a group of command buttons 64 which permit a user to modify the visual display and place it in different modes for ease of use. The command selection area lets medical personnel click on any icons within the command selection area and then implement a function on the image based on the command corresponding to the icon. The commands available include many of the type which are well know in the art, as well as some new, commands which are particular to the medical industry. For example, it may include such well known commands as zoom, move, brighten or darken, place characters at selected locations on the screen, and many others. The combination of these with the present user interface provides significant advantages in the ease of operation in properly performing a medical diagnosis. The selection tool 66 permits a user to select an arrow for use as a cursor on the image for selection of various command inputs on the image. The cinema mode button 68 permits the user to place the images in cinema mode within a specific series. Once in cinema mode, the user can scroll rapidly through an entire series with the rate of scroll being controlled by the user. The user, by rolling the mouse wheel, or left-clicking and moving the mouse while in cinema mode moves from one slice to the next slice at a rate proportional to the rate at which the button is rolled or the mouse is moved. The user can thus move rapidly but at a user-selected speed through an entire series so as to help construct an overall understanding of the medical diagnosis for the patient under study. Contrast button 70 permits a user to vary the contrast on the screen. Alphanumeric button 72 permits a user to input alphanumeric codes at various locations on the screen or to mark a particular image and enter text as desired. Link icon 74 permits a user to enter a command linking specific images in one series to specific images in another series. This is most useful in the dual display mode of operation which may be entered through button 76. By pressing display mode button 76, the user is able to select the number of images simultaneously shown on the visual display. They can select single image mode, which is shown in FIG. 3 having a single image on the screen. Alternatively, dual mode may be selected in which two images are shown on the screen side by side, quad mode selected in which four images are shown on the screen. Other modes may also be selected for showing multiple images on the screen, each image being selected from a different series. When the event the link button 74 is enabled, multiple series are shown on the screen at the same time and the same slice from each series will be shown. The slices are thus linked together so that when the user moves from one slice to another slice within a series that the visual display for the other series will also move to a matching slice within their own series so they are linked together. The user may thus have a slice from four different series displayed at the same time and be assured that the same slice from each series representing the same region in the medical body under study will be simultaneously displayed from each of the four series at the same time on the screen. Clicking on the camera icon 78 permits a user to take a snapshot of the current image shown on the screen. The hand icon 80 permits a user to move different objects around in the visual display while the magnifying glass icon 82 permits a user to select between various zoom options. The user can perform instant enlargements, for example, from 200%, to 400% or any other zoom or shrink option as desired. The hand icon 80 and zoom icon 82, like some of the other icons and their commands, are well known in the art in other systems and are provided as part of the unified user interface of the present invention for convenience of the medical personnel. Of course, many additional command icons may also be used.

The ruler icon 84 permits a user to create a scale on the screen, such as scale 86 shown at the bottom of the screen so as to measure the various features relative to the size of the actual features in the medical body of interest. The sync icon 88 permits a user to synchronize or move all images shown within a screen to the same slice automatically. For example, when the visual display is in dual or quad mode and the slices are not linked a different relative slice from each series may be shown. By clicking on sync button 88, the user interface instantly displays the same relative slice in each of the series currently being displayed on the user interface, thus providing rapid organization of the data for detailed analysis. The cell button 90 permits a user to divide a given image into a number of separate cells, with each cell having its own miniature image therein. Each cell will have a different slice from the same series. The user has the option to select the number of slices which will be simultaneously displayed from a given series by selecting the size and number of the cells. For example, the user may select a two-cell block, four-cell block, or larger number of cells such as 16, or larger depending on the number of slices in a particular series. The visual display will show for the user in the main display window the number of images which has been selected in the cell selection block 90 with each separate cell showing a different slice.

The user interface also includes a number of folders 92 from which the user may select in order to move to different parts of the visual display and enter commands into the system. A first folder 94 is a setup folder during which the user creates the settings by which the analysis will take place. For example, the user will choose the series which are to be viewed for analysis. During setup, the user also ensures that the various slices in one series are appropriately registered with slices in another series. Other types of operation may occur in the setup mode as described elsewhere herein. The stage folder 96 permits a user to actually input commands to perform the analysis. While in the stage mode, a region of interest icon 98 is provided which permits a user to select a region of interest at a user-selected location and at a user-selected size. While in the stage mode, the analysis of the data is carried out in a manner described in the previously filed co-pending applications by Stork et al. which have been incorporated herein by reference. The volume folder 97 permits the user to compute the volume of a particular segment of tissue and the report folder 99 is used for creating reports and other output from the system.

The main visual window 52 contains a number of features besides the selected visual image in order to assist in proper diagnosis and understanding the medical information. In the upper left-hand corner an analysis status indicator 100 is provided showing the status of the analysis for the particular slice image in the main display window 52. The analysis status indicator 100 provides a quick indication to the user of the current mode of the display and the results of any analysis which have been performed. In the embodiment shown in FIG. 3, the analysis status indicators are two round circles in outline form, indicating that an analysis has successfully been completed and there are areas in the slice which are similar to the reference cluster in the region of interest however, the similar region overlay is turned off. The color of the outline of the circles indicates the color of the similar area which would be present in the event the cover overlay is turned back on. Thus, viewing FIG. 3 the raw grayscale images seen with a box indicating the region of interest however the results of analyzed tissue match is not highlighted or shown since the overlay has been turned off as indicated by the border circles in the analysis status indicator 100.

Figure 4:
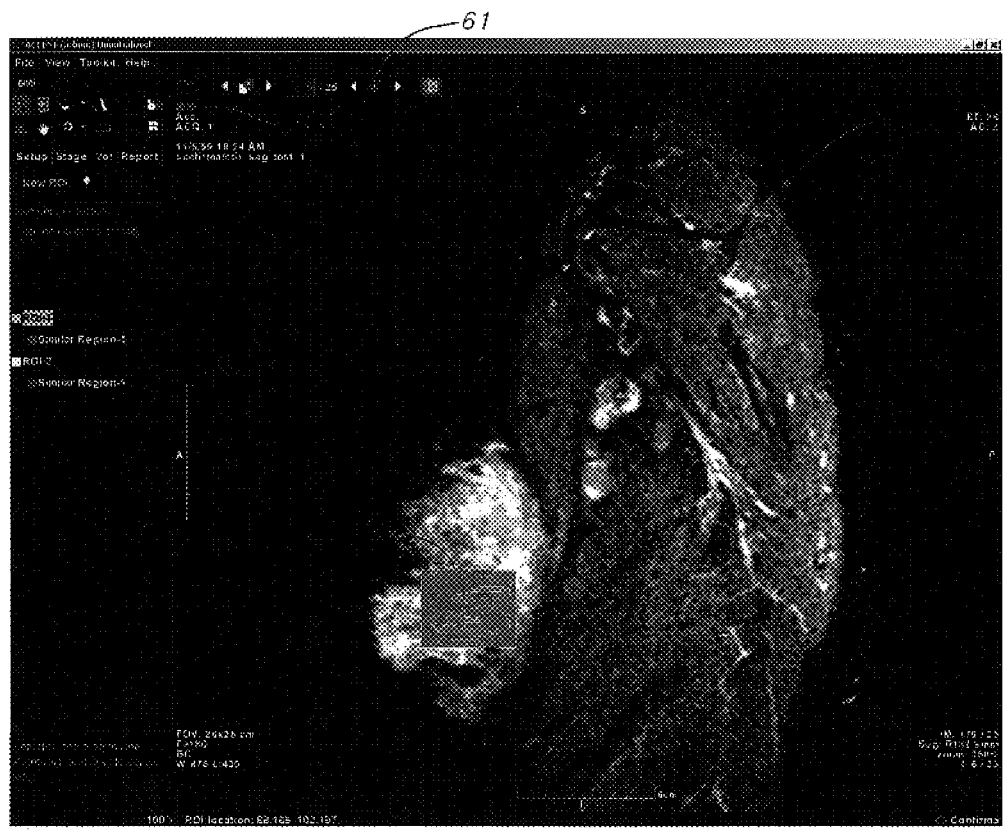
FIG. 4 is a user interface of the same image but with different areas and different color scale according to principles of the present invention.

FIG. 4 is the same image of the same slice however the only difference being that the analysis status indicators have been turned on so as to indicate that the color overlay is present showing similar tissue highlighted as explained in more detail herein.

Figure 8:
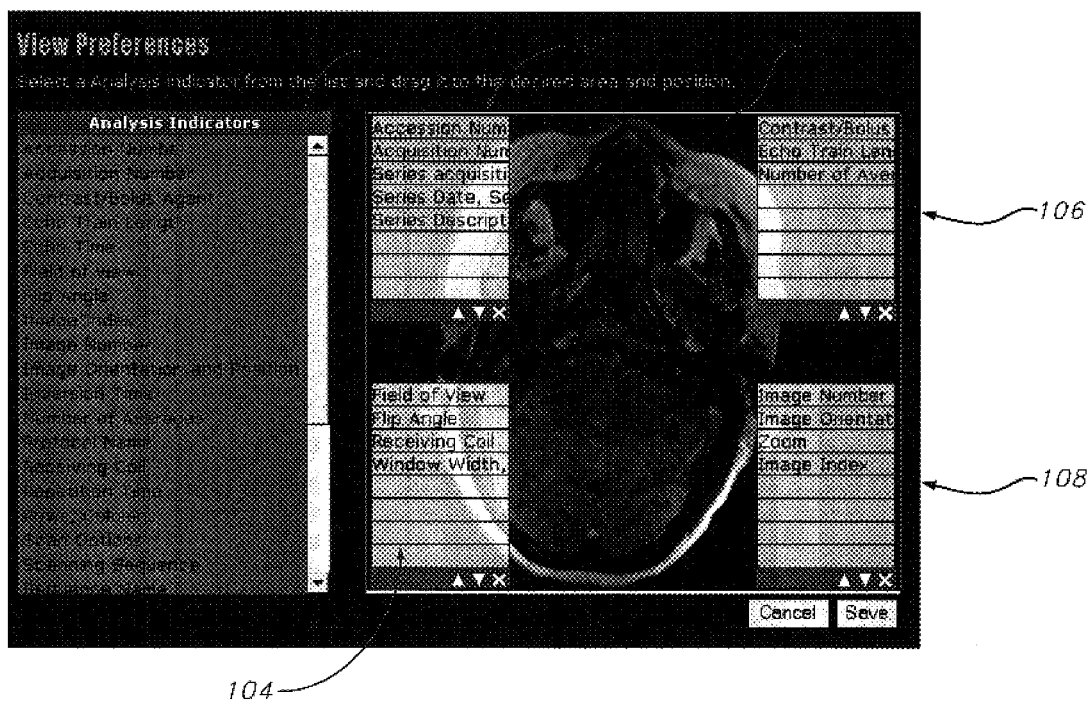
FIG. 8 is an illustration of the customization capabilities of the user interface according the principles of the present invention.

The main image window 52 also contains additional data relative to the medical image under examination as explained in more detail herein with respect to FIG. 8. In summary, in the upper left-hand corner 102, a group of user-selected data are provided which may include such things as the sequence, the type of image under examination, the date and time of the current image. In the lower left-hand corner of the main display window 52 other user-selected data 104 are displayed. This may include such things as the size of the image, certain dimensions or parameters of the image, the window width, field of view and other features. The upper right-hand corner 106 and lower right-hand corner 108 similarly contain user-selected information. For example, in FIG. 3 the lower right-hand corner includes such information as the zoom magnification which, for the same image shown is 360%, the location of the slice within the body of interest which, for this example is SAG:R132.9 mm, the slice ID or other information which a user may desire to place there. This is explained in more detailed with respect to FIG. 8 herein.

FIG. 4 provides the same medical image within the main window 52 in which the overlay has been turned on. The indication that the overlay is turned on can be easily seen by viewing the analysis status indicator box 100. As can now be seen, the circles are solid colors having the color of the various tissues which have segmented and displayed on the image based on their location throughout the medical body under examination. With the color overlay turned on, the user can easily see all tissue which has similar characteristics within the entire medical image under examination.

The value, and use of the analysis status indicators will now be explained in more detail with respect to FIGS. 5 and 6.

Figure 5:
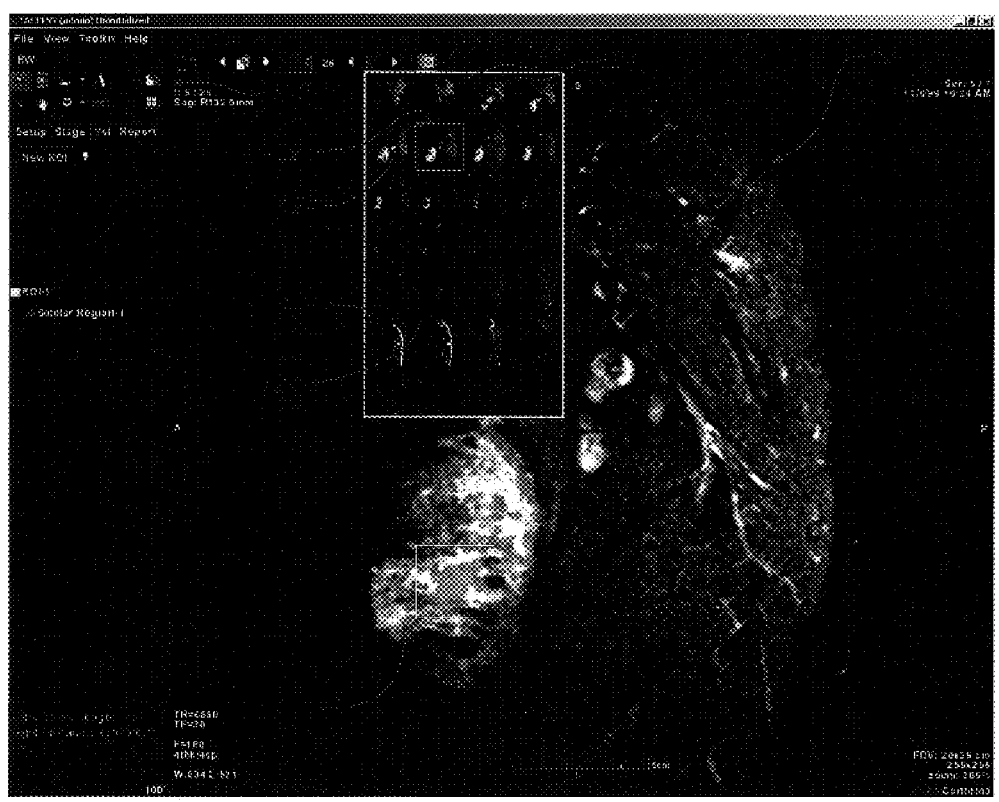
FIG. 5 is a user interface showing analysis indicators according the principles of the present invention.
Figure 6:
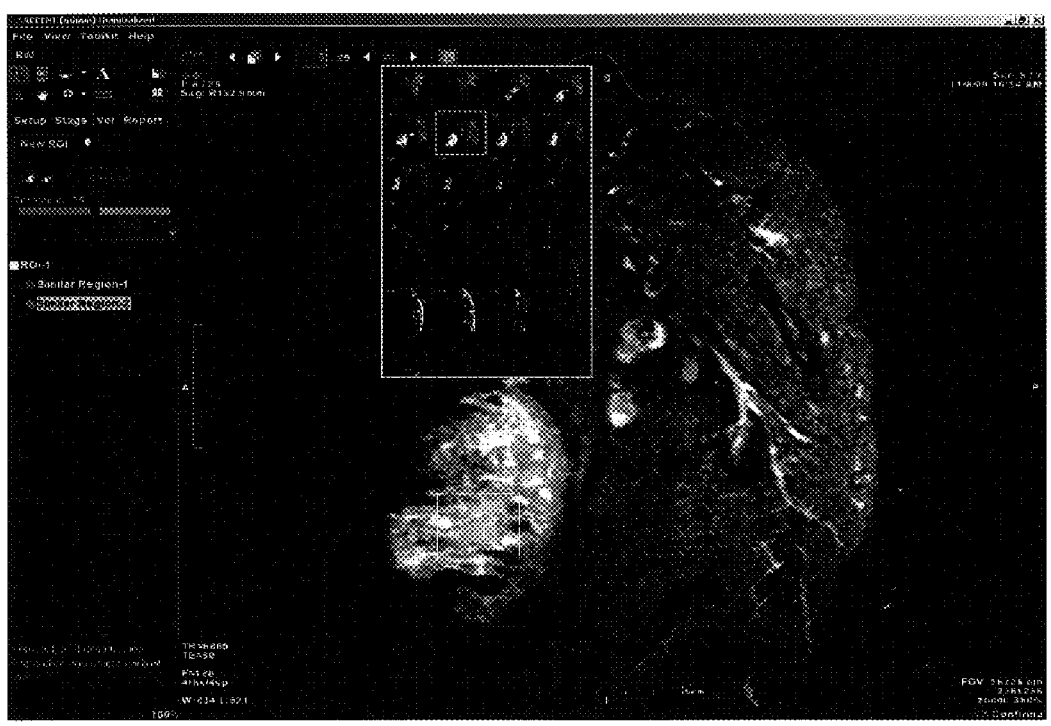
FIG. 6 is an additional user interface showing analysis indicators according to principles of the present invention.

FIGS. 5 and 6 illustrate a slice in which a number of similar regions have been highlighted in a color designated by the user. The segmentation has been completed and the analysis concluded for the particular slice so that all similar regions are shown in a common color. The analysis was also carried out on every slice in the series and on every slice in every other series that is part of the analysis.

A similar region is defined as a region on a grayscale or color image which is highlighted by a distinct color overlay or other visually distinct labeling (i.e., cross-hatched, outlined or other) which identifies it as similar to a reference region as determined by segmentation Analysis status indicators are displayed on each image of a study where segmentation has identified a region similar to the reference region. The primary functions of status indicators are:

1. While segmentation is in process, analysis status indicators show which images for which the analysis is incomplete, to reduce the likelihood of errors resulting from premature interpretation of the images.

2. When segmentation is complete, the analysis status indicators define the images within the study in which similar region labeling exists.

3. The analysis indicators also identify which images were part of the data set used for the segmentation.

The analysis status indicators can take many forms in order to provide immediate, and useful information to the user as to the status of any analysis which is being performed or has been performed on the slice.

Below is a table describing the possible states of the analysis status indicators on the image according to one embodiment of the invention:

X  Indicates the image is not part of the analysis set, thus there are no analysis results for this image. It may also indicate the image could not be analyzed even though it is part of the analysis set due to an error during the analysis (for example, there was a missing series for this slice set).

≋  The slice is waiting for classification or thresholding to complete. The color will match the color of the similar region. This indicator is shown in the middle of the image (rather than the upper left corner) to ensure the user is aware that analysis has not completed for the slice.

●  Analysis has successfully completed and there are pixels included in this slice for the similar region, and the similar region overlay is turned on. The fill color of the circle will match the color of the similar region.

○  Analysis has successfully completed and there are pixels included in this slice for the similar region, however, the similar region overlay is turned off. The border color of the circle will match the color of the similar region.
   Image is part of the analysis set. The area for a similar region's indicator is blank if there are no labeled pixels included in this slice.

On the thumbnail images, the analysis status indicators are limited to the following states:

| |
|---|
| ⊗ The slice is waiting for classification or thresholding to complete. The color will match the color of the similar region. This indicator is shown in the middle of the image (rather than the upper left corner) to ensure the user is aware that analysis has not completed for the slice. |
| ● Analysis has successfully completed and there are pixels included in this slice for the similar region, and the similar region overlay is turned on. The fill color of the circle will match the color of the similar region. |

FIG. 5 shows a typical result using the analysis status indicators in both a full image and thumbnail version of the series (image 6 of 25 in the series). The magenta labeling on the grayscale image is the similar region labeling that is produced by the segmentation. The filled-in analysis status indicator in the upper left corner of the grayscale image, in the same magenta color as the similar region labeling, depicts the existence of labeling on that image upon completion of the segmentation process. Images without labeling have a blank (not filled-in) analysis status indicator.

An analysis status indicator is displayed for each segmented similar region. Therefore, if multiple similar regions exist on an overlay, multiple corresponding status indicators will appear on both the full image and thumbnail versions. FIG. 6 depicts an analysis result with multiple (2) similar regions.

The analysis status indicators are updated in real time, so the user is able to ascertain the processing status of any image as the segmentation proceeds.

The user can toggle the similar region overlays off to more completely view the underlying image. The analysis status indicators toggle on and off in tandem with the similar region overlays.

The benefits this feature provides the user are as follows:

1. User efficiency in reviewing images—An individual imaging study may consist of up to hundreds of images. The analysis status indicators, particularly on the thumbnail images, efficiently guide the user to the images containing segmented regions and therefore often the most important images in the study.

2. Accentuates images with minimal labeling—After segmentation, an image can contain only a few pixels of critical labeling, which may be overlooked by a user. The analysis status indicator draws attention to such minimally labeled images, thus mitigating the possibility of them being overlooked.

3. Additional analysis information—Positioning the pointer over an analysis status indicator will display a tool tip window that describes the meaning of the symbol. When the analysis status indicator indicates that the image is not part of the data used for segmentation, for example, the tool tip explains the reason for its exclusion.

The thumbnail views, and the advantages of how they are displayed within the current user interface will now be explained in more detail with respect to FIGS. 5 and 6. As an overlay to the main image window 52 a thumbnail window 120 is created when the thumbnail icon 61 is activated by a user. The thumbnail window 120 appears at a central, upper location as an overlay to the main visual display window 52 in a preferred embodiment. This particular location as shown in FIG. 5 for the thumbnail window 120 provides ease of reference and central viewing location for users and therefore is preferred. It overlays on top of a portion of the larger image and thus provides a frame of reference. Since the user may easily remove the thumbnail window by selecting button 61, having it overlay a portion of the image for a period of time does not interfere with the medical analysis. In alternative embodiments, the thumbnail window 120 may appear at different places within the main window 52, such as the upper left-hand corner, lower right-hand corner or other places so as not to obscure the main image in the window. Alternatively, it may appear on another visual display adjacent to the visual display having the main image window 52 or some other location.

The thumbnail window 120 contains a thumbnail sized, namely miniature, visual image of every single slice 26 in the series within a window. Thus for a selected series type, such as STIR, each slice 26 within the series will appear in the thumbnail window 120 in miniature form within its own smaller window. The particular slice 26 which is in the main display window 52 will have a box 122 around the slice indicating to a user that that is the slice currently under examination. Within each thumbnail image an analysis status indicator is provided indicating the results of the analysis carried out on that particular image. Thus for each thumbnail image, an analysis status indicator 124 is associated with it providing an indication to a user as to the results of a computer analysis of the data contained within the image for that particular slice and series. In the preferred embodiment, the analysis indicator 124 is in the upper left-hand corner of the window that contains the image it is associated with. The use of the analysis status indicator 124 associated with each of the thumbnail images permits a radiologist to be alerted that the particular image contains tissue that matches the tissue in the selected region of interest. This will then draw the user's attention immediately to that particular slice for further study. The presence of the status indicator 124 on any slice can quickly, and easily be seen by any user so that slices of interest can be easily selected out of the hundreds of slices which may be presented for examination of a particular patient. This saves considerable time and effort of the user having to minutely study every single slice of every single series and provides a direct pointer for the radiologist or other medical personnel to those areas of tissue which likely contain malignant growth, cancerous tissue or other tumors which match the characteristics of the tumor within the selected region of interest. The advantages provided by having the analysis status indicators 124 within each thumbnail slice and also shown as status indicators 100 on each image of each slice can be understood by viewing the thumbnail series 120 within FIG. 5 assuming, for example that the selected tissue represents a cancer or other malignant growth. It is the task of the radiologist, or other medical personnel, to determine the size, shape and location of the tumor so as to prescribe the appropriate medical treatment. For a tumor of a given size, different medical treatments may be required. If the tumor is relatively small and confined then surgery alone may prove sufficient to completely remove the tissue of interest from the body. On the other hand, if the tissue has metastasized and begun to spread to other regions of the body additional therapy may be called for, such as chemotherapy, and other kinds of treatment. If the radiologist, by examining a particular slice, such as shown in FIG. 5, slice 6, and locates a known cancerous site it is their desire to determine the size and spread of the cancer cells so that the appropriate course of treatment can be properly carried out. The radiologist will look at adjacent slices, such as slices numbers 2, 3, 4 and 5 which precede slice 6 and also subsequent slices, such as slices 7, 8, 9 and 10 in order to locate the exact bounds and determine the volume of the tumor. The radiologist will examine those adjacent slices in order to determine the boundaries and extent of the tumor.

Reviewing the thumbnail window 120 it can be seen that slices 1 and 2 do not contain similar tissue to that identified as the reference tumor in the region of interest. A radiologist thus reasonably assumes that there is no tumor tissue within those segments of the medical body under study and does not examine these images in fine detail. Slice 3 is the first slice in which matching tissue is located as can be seen by the analysis status indicator 124 being present in the upper left-hand corner of the box representing slice 3. The radiologist may then study slice 3 in detail by bringing it into the main image window 52 and performing various analysis on the slice to determine the exact edge and boundaries of the tumor. The radiologist will then step through slices 4 and 5 in order to understand the shape and boundaries of the tumor under study. The radiologist will continue to step through various slices up to slice II in order to understand the shape and boundary of the tumor under study. Slices 12 and 13 do not have any matching tissue. Without use of the present invention, the radiologist may spend a great deal of time studying slices 12 and 13 in an attempt to locate matching tissue in order to be assured of the proper scope and boundary of the tumor under study. With the analysis status indicators of the present invention a quick glance at the thumbnail images shows to the radiologist that a detailed study of these slices is not necessary. Slice 14 however shows some indication of matching tissue type. Since none of the adjoining slices have matching tissue type this may be an artifact due to over-sensitivity of the machine or may actually represent a separate small site of tumor located only in this section of the medical body under study. The radiologist has his attention immediately drawn to slice 14 which he may study in detail and compare to the slices on either side to determine whether or not the tissue is of a type which corresponds to metastasized cancer and therefore treatment is required or whether, on the other hand it is representative of an artifact and not tissue of interest.

With the analysis indicators of the present invention as a guide, the radiologist then notes that slice numbers 20–23 each contain an analysis status indicator showing that there is tissue in each of those slices which corresponds to the region under interest. Since four sequential slices all contain an indication of tissue under study the radiologist is immediately drawn to this sequence of slices for detailed study. In the particular example shown, these slices correspond to the spinal column of the patient for which an analysis is being performed for breast cancer. The radiologist has now been alerted that the cancer may have metastasized and spread to locations within the spinal column or other adjacent locations. The radiologist may therefore request additional medical images or biopsies be made of the spinal column to determine whether or not the tissue of interest is present and select a proper medical treatment plan if such tissue is found.

The analysis status indicators within the thumbnail images then provide a significant advantage of drawing the attention of the radiologist to a sequence of slices which have been indicated by the computer analysis to contain similar tissue and warrant further study. One disadvantage of systems without the user interface of the present invention is that similar regions, including cancerous cells of different types of cancer may be missed without the use of the analysis status indicators. As was common in the prior art, as the radiologist searches for breast cancer he locates the tumor within the tissue under study and by examining adjacent slices is able to determine the boundary and volume of the tumor within the tissue under study. The radiologist will naturally look at two or three adjacent slices which do not have the tissue under interest in order to be assured that he has found the proper boundary. In the example shown in FIG. 5, there are at least five sequential tissue slices, numbers 15–19, after the tumor with no tissue of interest located within each slice. The radiologist therefore reasonably assumes that he or she has performed sufficient study to have found the boundary of the tumor and will prescribe a treatment plan based on what is believed to be the location and extent of the cancerous tissues. The medical treatment plan carried out will thus not be based on an accurate representation of the cancer's location. The user interface of the present invention has analysis result indicators which draw the user's attention to all slices which contain tissue of interest, thus permitting rapid and highly reliable analysis of the image data. Of course, the analysis indicators can be any appropriate symbol at a convenient location. The shape, color, location and marks can be chosen to be of a type that will easily and rapidly draw a user's attention to those slices which contain similar data. While round circles in the upper left hand corner of each image have been used, other symbols in other locations are acceptable.

A description will now be provided of how the analysis is carried out and the analysis indicators placed on an image representing each respective slice. FIG. 5 illustrates a medical image in the main window 52 and each slice from the same series in a thumbnail window 120 after an image analysis classification of the tissue types has taken place based upon a region of interest 44 for first tissue type. FIG. 6 illustrates that a classification analysis has been accomplished for a second tissue type within the region of interest 44, the second tissue type being indicated by a different color scale, such as a different color from the spectrum green or a different level of grayscale. An explanation of the classification which is carried out is helpful in understanding the benefits obtained with the analysis status indicators according to the present invention. As previously illustrated in FIG. 2, a single medical study may include a series of many different types of data, usually in the range of five to eight different series. Each series contains a large number of slices so that many hundreds of different images must be analyzed in order to perform the classification system of selected tissue type within the region of interest. When a user is performing the first tissue classification analysis, which is done in order to generate the results as shown in FIG. 5, or desires to perform a second classification analysis on a different type of tissue within the region of interest, he or she will indicate the reference tissue on which the classification is to take place and then input a command to the computer to begin the classification analysis. The classification analysis is very data-intensive and takes a set amount of time to complete. For larger, more complex images and larger data sets the time is correspondingly longer. The analysis uses the combination of data from each slice in the series in order to complete the analysis. Thus, all slices within a single series must be analyzed and further, every slice in every series is analyzed in order to perform the classification. During the classification, each slice in each series is marked with an analysis indicator in the procedure showing the results of the analysis as related to that particular slice within that particular series. While the classification is taking place, an hourglass is shown, as previously explained herein, indicating that the classification or thresholding is being conducted for that particular slice. After the analysis has been successfully completed, and if there are pixels included in the slice which have a similar tissue type, then the appropriate analysis indicator will be shown in the upper left hand corner of the image. If the image could not be analyzed for various reasons, such as computer error or data mismatch, an X will appear alerting the radiologist that an analysis has not been carried out for that particular slice. If the image is part of the analysis set but similar tissue has not been found within the slice, the analysis status indicator will be blank, which will indicate there are no pixels corresponding to the similar tissue within that particular slice.

The analysis status indicators are provided on each slice within each of the series providing significant advantages in quickly examining the hundreds of images. Once the analysis is completed, the radiologist may quickly move to a new series and, by clicking on the thumbnail icon 60, display a thumbnail image of all slices within the new series under study. Since the analysis has already been conducted, each thumbnail image will appear quickly and will have thereon a status indicator showing which slices within the set contain similar tissue. The radiologist may do this for each series under study. The radiologist then uses the various commands available as explained with respect to FIG. 3 in order to organize the various images together on the same screen for detailed study, to print a report, or perform other analysis. For example, once the radiologist has identified the particular series of interest and wishes to examine a slice set having the same slice from many different series, he can activate the series display icon 76 and therefore show the same slice from many different series for study in detail to understand more completely the scope and type of tissue under investigation. The user may also activate the button 90 to show a desired number of slices from each set within the plurality of different series to perform a detailed analysis on a selected number of series. Each time the images are produced from the various series, the analysis status indicators will be present in the upper left hand corner, providing a clear indication to the radiologist whether the slices contain similar tissue. This will thus provide a rapid indicator to the radiologist of those exact slices and those areas within each slice for which detailed study is needed and will also free the radiologist from having to study hundreds of slices in detail which can easily be seen as not containing similar tissue of interest. The radiologist will continue to use other commands which are available, such as the link command, ruler command, and other options in order to study the tissue in detail after the analysis has been performed, taking advantage of the analysis status indicators to guide him to those images for which further study would be beneficial. The combination of the various commands with the analysis status indicators is thus beneficial. Those commands which have been previously known in the art in isolation, without the analysis status indicator become much more powerful and beneficial when now used in combination with the analysis status indicator of the present invention. Each time a different region of interest is analyzed a new analysis status indicator is generated with respect to that particular region of interest having the color scale selected for the particular tissue type under study.

FIG. 6 shows that within the region of interest 44 a second, separate tissue type has been selected for analysis and classification and, following such analysis, a thumbnail window 120 is displayed which shows in each thumbnail view those images which contain either or both of the tissue types of interest. In this particular analysis, the new tissue under study is selected to have a color of light green though, of course, a grayscale, crosshatch, or other pattern could have been selected. As can be seen by viewing the thumbnail 120 in FIG. 6, the new tissue type has been found in each of the slices which contained the tissue type of the previous analysis. Thus, the two analysis status indicators appear side-by-side in the upper left hand corner for those images. In addition, the second tissue type is also shown as being present in slices which did not contain the first tissue type as can quickly and easily be seen as a result of using the analysis status indicators. Viewing thumbnail block 120 of FIG. 6 it can now be seen that slice 12 contains the tissue under study as does slice 13 whereas in FIG. 5 the slices did not contain that particular tissue under study. The radiologist can now see that there is tissue of interest in contiguous slices from slice 3 to slice 15, and this becomes even more apparent by a quick glance at the thumbnail window 120 by looking at the analysis status indicators in the upper left hand corner of the thumbnail view of the slices. The radiologist may now quickly look at the slices not previously considered of interest and compare them to the other slices and different series of the same slice to perform a detailed analysis for a better understanding of the type of tissue under study as well as it volume and location within the patient. The ability to provide multiple analysis status indicators therefore is a distinct advantage for the radiologist. This permits the radiologist to rapidly identify those images which contain both tissue types and also the length of a string of images that contain either one of the tissue types.

Figure 7:
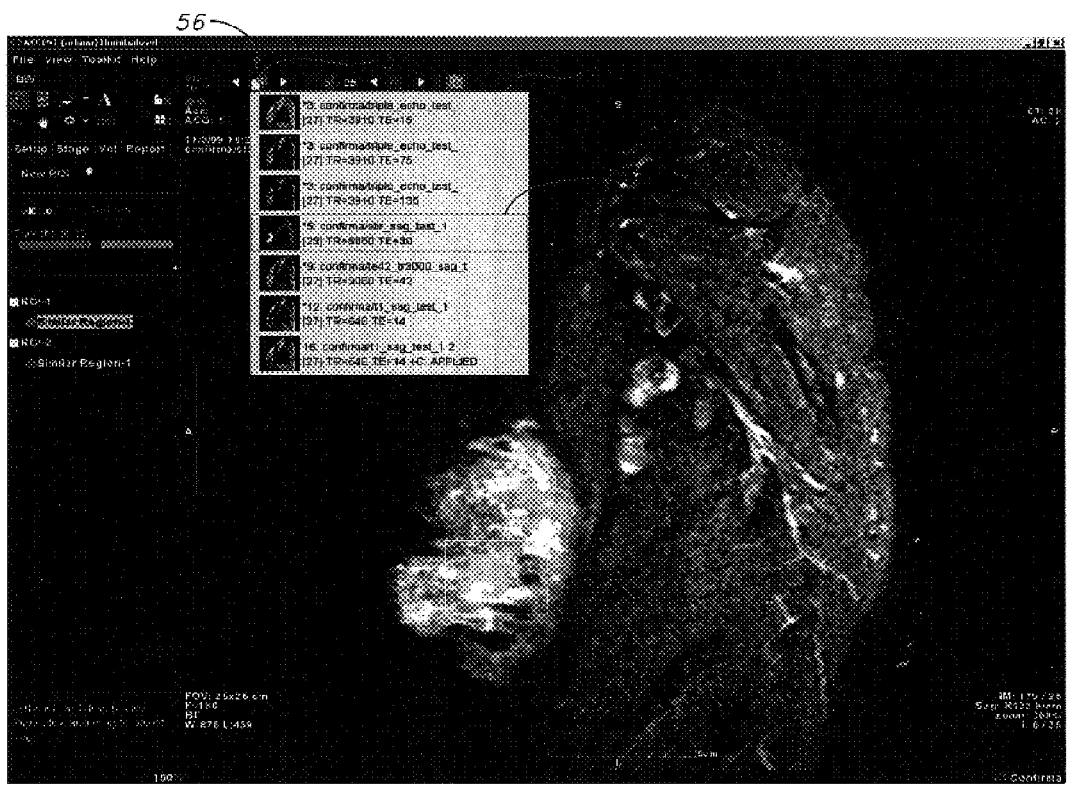
FIG. 7 illustrates another advantageous feature of the user interface according to one embodiment of the present invention.

FIG. 7 illustrates a display which is provided to a user for assistance in the analysis in understanding the data available. Within the series selection box 56, the user may click on the series identification icon 57 in order to create a miniature window 130 of the slices which are part of the computer analysis. By selecting the series detail box 57, the window 130 automatically pops up and illustrates to the user the type and number of series in the study, and indicates which series data are being analyzed and provides an easy description of each series. In the example shown, seven different series are in the study, and six of them are part of the computer analysis. The series includes, in this example, triple echo series having various parameters, a STIR sequence having various parameters, as well as two different T1 sequences having different parameters. The user, if desired during the setup stage, may add additional series to those which are to be analyzed if the data has been collected. The user may also elect to remove certain series from the analysis if it is deemed not necessary for performing a complete analysis or if focus is desired on a smaller number of series for a particular region. The series currently on display is highlighted, shown by highlight box 134 which in this example is a stir sequence having selected parameters and orientations.

FIG. 8 illustrates the user selectable information which may be placed at the respective corners of the main image window 52. On the left hand side of FIG. 8 is shown a selection of information details 101 from which any medical personnel, such as a medical technician, a radiologist, physician, or other user, may select for showing in the main image window 52. These information details within the table 101 include a number of indices, such as, accession number, acquisition number, contrast agent used, scanning sequence, sequence name, and a number of others which may be of interest to a user. A user will select an information detail from the list 101 and drag it to the desired area and position within the respective box in which they wish to have that indicator appear. In the example shown, user has selected the accession number and dragged it to box 102 in the upper left hand corner and clicked to leave it in the box. A similar click-and-drag has occurred for other information details from list 101 into box 102 as indicated for the acquisition number, series acquisition, series date, and series description. The user interface provides these simple instructions that will be easy, even for an untrained user to follow. For box 104 in the lower left hand corner the user has selected such information details as field-of-view, flip-angle, receiving coil, and window width/level. The other information details which have been selected and dragged into the respective boxes 106 and 108 are shown in the example given in FIG. 8. The information details so positioned within the respective boxes will then show in the main image window 52 when the image is being viewed in a manner similar to that shown in FIGS. 3–7 as has previously been described. A user is thus able to program the data which is shown on the screen in an administration mode, setup mode, or other acceptable mode and then, once saved, is able to have the information available during examination of the images for performing the medical diagnosis.

Figure 9:
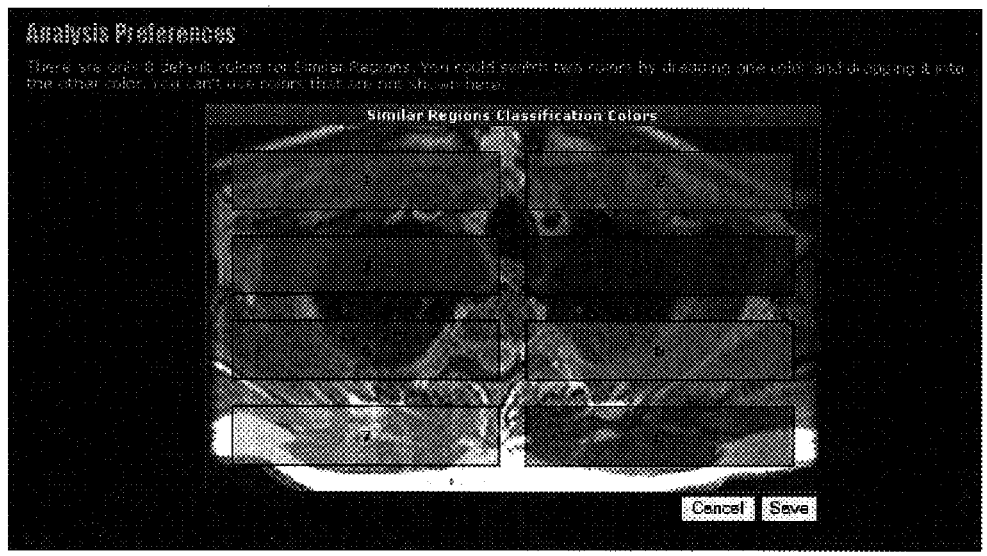
FIG. 9 is a further user interface for user selectability according the principles of the present invention.

FIG. 9 illustrates the user's capability of selecting color schemes and various contrasting colors for highlighting similar regions within the classification scheme. The user selects those colors desired as primary colors and secondary colors and has the option of switching the colors to any desired value. According to a preferred embodiment, the colors which a user may select are limited to those within a preset library which has been previously tested and shown to be particularly effective in providing high contrast with respect to other colors and with respect to a grayscale image for easy identification by a user. The colors are of a type which can be quickly seen and spotted in the analysis indicators in the upper left hand corner as has been previously discussed. Another feature is that the user may toggle the property of the colors to a semi-transparency representation in the image below. Namely, as can be seen in FIG. 9, the actual grayscale image is slightly visible below the color so that the user is able to identify the particular location and shape of tissue structure with the color overlay present. While in some computer user interfaces, an effort is made to provide to the user the largest possible range of colors from which to select and to use in combination with each other, the preferred embodiment of this invention presents a pre-tested library of colors and limits the users selection to only those colors within the provided library.

In an alternative embodiment, different from the preferred embodiment, other colors may be made available from which a user may select to overlay on the images. Thus, other color schemes may be later adopted, and provided as analysis indicator colors if studies indicate an acceptable contrast with respect to the underlying data.

Figure 10:
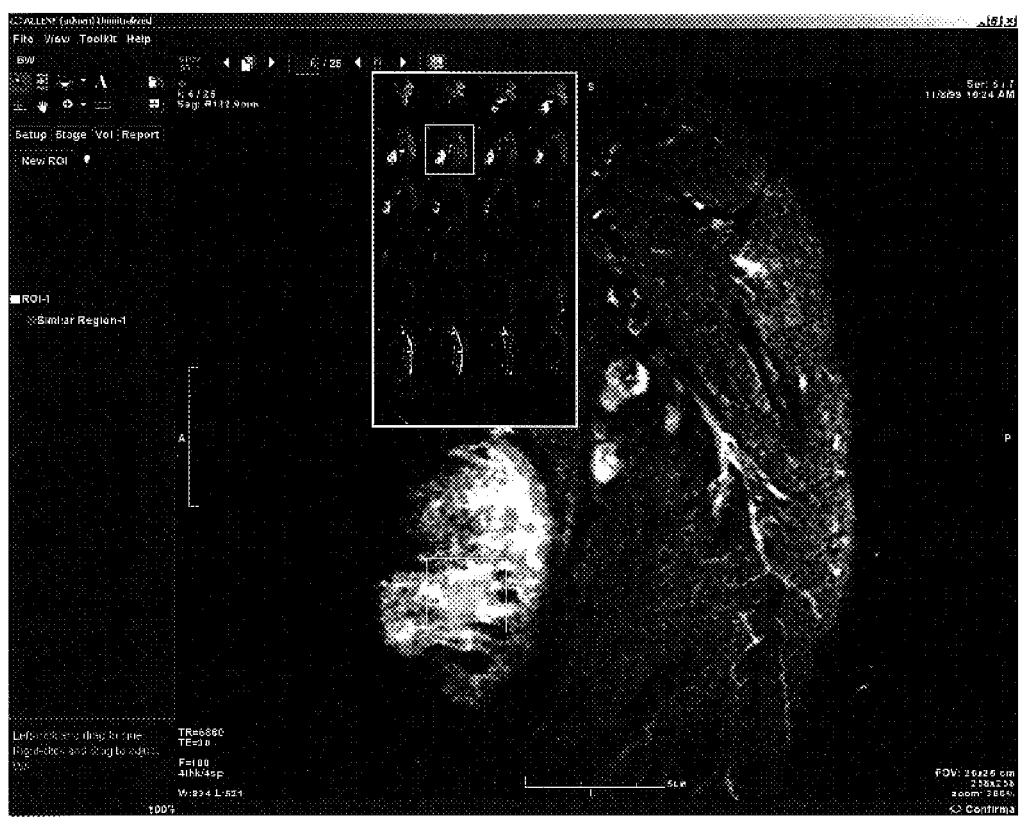
FIG. 10 is a grayscale image of the user interface shown in FIG. 5.

FIG. 10 illustrates the same features from FIG. 5 except on a grayscale image. FIG. 5, as submitted and as used in a preferred embodiment, has a grayscale in the underlying medical image and then an overlay color scheme selected from the color library that is other than a grayscale, for the analysis indicators and the highlighting of similar regions of tissue in different portions of the image outside the region of interest. Such a color scheme is preferred because of the advantages provided for quick and easy identification and analysis by a radiologist. In an alternative embodiment, a grayscale color scheme may be used for all analysis factors as indicated in FIG. 10. Namely, the analysis indicators are provided on a grayscale level as are the markings of the similar regions of interest within the image under examination. A grayscale color scheme is therefore one of the schemes which is available for the user if the appropriate equipment is available for the gray scale.

In the embodiments shown, the analysis indicators 100 are in the upper left-hand corner of the window which contains the image under study. Thus, the main window 52 which includes the main image has, at its upper left-hand corner, the analysis indicator 100 for that particular image. Within the thumbnail window 120, there are a number of images each of which is within its own miniature window. Each of the miniature windows has, in its upper left-hand corner, a position reserved for the analysis indicator. The analysis indicator is therefore within the same window of the image that it is associated with, and is in the upper left-hand corner of that window. This provides a single, uniform location for the analysis indicator relative to each image it is associated with. This provides considerable ease for the radiologist in looking quickly for analysis indicators in determining the image that it associated with. Of course, the analysis indicators associated with each image could be in any other relative location or take any other form. For example, they could take the form of a change in color of a box outlined in the window, a change in color of an outline of the image, a temporary change under selection of a button of the color of the entire image, or any other equivalent tool which will quickly and easily identify for a user those images which have a region of interest thereon similar to the region of interest which has been identified by the radiologist.

Of course, the image under study can be any acceptable image for which a detailed investigation is to be performed comparing images of the same object to each other or images of one object to images of another object. In the preferred embodiment, the object under study is human tissue and the region of interest corresponds to cells within the human body having a disease or particular impairment, such as cancer, Alzheimer's, epilepsy, or some other tissue which has been infected with a disease. Alternatively, the region of interest may be certain types of tissue that correspond to body organs, muscle types or certain types of cells for which an analysis or investigation is desired. As a further alternative, the object under investigation may be any physical object, such as an apple, bottles of wine, timber to be studied, or other detailed object for which an analysis is to be performed and a search made for similar regions of interest within the object itself, or for one object to another.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

I claim:

1. A user interface for a medical image comprising:
a memory for storing a plurality of data sets, each data set corresponding to an image of a location within a medical body of interest;
a plurality of data points within each image, each data point corresponding to a measured parameter collected from the medical body of interest;
a visual display having the image thereon, the image being composed of a visual representation of the respective data points for that image;
a color scale variation on the visual display of the image configured to a first color scale variation of those data points in the image that have been analyzed and determined to have a first common characteristic and configured to provide a second color scale variation of those data points in the image that have been analyzed and determined to have a second common characteristic; and an image analysis indicator on each of the plurality of data sets that contain at least one data point determined to have either the first or second common characteristic, the image analysis indicator showing the color scale variation corresponding to the different characteristics of the data.

2. The user interface of claim 1 wherein the image analysis indicator is configured to selectively show the first color scale variation or the second color scale variation based on user selection of the first common characteristic or the second common characteristic, respectively, in each of the data sets.

3. A user interface for the visual display of an image from an object under study comprising:
 a visual display terminal having thereon the image from the object under study;
 a color overlay on the image as presented on the visual display terminal indicating locations on the image that correspond to tissues of interest; and
 an indicator on the visual display terminal at a location spaced apart from the image indicating that the image has the color overlay thereon, wherein the color overlay and the indicator are the same color as each other on the visual display terminal.

4. The user interface according to claim 3, wherein the color overlay indicates similar regions of material within the object itself that have been identified by a computer analysis of the data collected about the object.

5. The user interface according to claim 4 where in the object is a medical body and similar regions correspond to tissues that have similar characteristics.

6. The user interface according to claim 5 wherein the tissue is a type of cancer.

7. The user interface according to claim 3 wherein the indicator is at a selected location on the visual display terminal to attract the attention of a user.

8. A user interface for the visual display of an image from an object under study comprising:
 a visual display terminal having thereon the image from the object under study;
 a color overlay on the image as presented on the visual display terminal indicating locations on the image that correspond to tissues of interest;
 an indicator on the visual display terminal at a location spaced apart from the image indicating that the image has the color overlay thereon;
 a plurality of images of the object under study displayed simultaneously on the visual display terminal; and
 indicators present on the visual display terminal associated with each of the plurality of images that have a tissue of interest thereon, indicating whether each respective image has a tissue of interest thereon.

9. The user interface according to claim 8 further including:
 a color overlay on those images within the plurality of images that contain regions of interest on the image.

10. A user interface for the visual display of an image from an object under study comprising:
 a terminal having thereon plurality of images of the object under study;
 tissue of interest identified on at least one of the images under study;
 a tissue of interest indicator selectively displayable on the terminal to identify a location of the tissue of interest in the images containing the tissue of interest; and
 a marking associated with each of the images indicating those images which contain a region of interest that is similar to the tissue of interest, the marking being spaced from the tissue of interest within each respective image wherein the markings has a first form when the tissue of interest indicator is selectively turned on and a second form when the tissue of interest indicator is selectively turned off.

11. The user interface according to claim 10 wherein the marking associated with each image is spaced from the image.

12. The user interface according to claim 10 wherein the marking associated with each image is at an identical location relative to the image it is associated with for each of the respective images.

13. The user interface according to claim 10 wherein each of the plurality of images is within a window and the marking is at the upper left hand corner of a window that includes the image.

14. The user interface according to claim 10 further including:
 a tissue of interest marking on the image indicating the location within the image itself that contains the tissue of interest.

15. The user interface according to claim 14 wherein the tissue of interest has a selected color within each image and the marking has the same color as the tissue of interest.

16. A method of indicating images within a set of images that contain a region of interest comprising:
 locating in a first image a first user-selected type of tissue within a region of interest;
 locating in the first image a second user-selected type of tissue within the region of interest;
 analyzing the images of the selected tissue type to thereby determine the characteristics of the first and second tissue types, respectively;
 performing a computer analysis on the image to locate within the image any tissue having characteristics similar to the characteristics of the first tissue within the region of interest;
 performing a computer analysis on the image to locate within the image any tissue having characteristics similar to the characteristics of the second tissue within the region of interest;
 performing a computer analysis of a plurality of images to locate within each of the images any tissue having characteristics similar to the characteristics of the first tissue type;
 performing a computer analysis of a plurality of images to locate within each of the images any tissue having characteristics similar to the characteristics of the second tissue type;
 selecting the first or second tissue type; and
 placing an analysis status indicator associated with each image that contains the selected tissue type.

17. The method according to claim 16 wherein each image is within a window on a visual display terminal and the analysis status indicator associated with that image is in the upper left hand corner of that window.

* * * * *